United States Patent [19]

Fujita et al.

[11] Patent Number: 5,834,769
[45] Date of Patent: Nov. 10, 1998

[54] ATOMIC BEAM PATTERN FORMING METHOD USING ATOMIC BEAM HOLOGRAPHY

[75] Inventors: Jun-Ichi Fujita; Fujio Shimizu; Shinji Matui, all of Tokyo, Japan

[73] Assignee: NEC Corporation, Tokyo, Japan

[21] Appl. No.: 895,273

[22] Filed: Jul. 16, 1997

[30] Foreign Application Priority Data

Jul. 19, 1996 [JP] Japan .................................. 8-190739

[51] Int. Cl.⁶ ................................................ H01J 37/302
[52] U.S. Cl. ........................................................ 250/251
[58] Field of Search ................................ 250/251, 492.2

[56] References Cited

U.S. PATENT DOCUMENTS 4,536,657  8/1985  Bruel ........................................ 250/251

OTHER PUBLICATIONS

Shimizu et al., "Stark Phase Shift and Deflection in the Ultracold Atomic Interferometer", *Jpn. J. Appl. Phys.*, vol. 31 (1992), Part 2, No. 4A, Apr. 1, 1992, pp. L–436–L438.
Fujita et al., "Manipulation of an atomic beam by a computer-generated hologram", *Nature*, vol. 380, No. 6576, Apr. 25, 1996, pp. 691–694.
Morinaga et al., "Holographic Manipulation of a Cold Atomic Beam", *Physical Review Letters*, vol. 77, No. 5, Jul. 29, 1996, pp. 802–805.
Ogai et al., "Nanofabrication of grating and dot patterns by electron holographic lithography", *Appl. Phys. Lett.*, vol. 66, No. 12, Mar. 20, 1995, pp. 1560–1562.
McClelland et al., "Laser–Focused Atomic Deposition", *Science*, vol. 262, Nov. 5, 1993, pp. 877–880.

*Primary Examiner*—Kiet T. Nguyen
*Attorney, Agent, or Firm*—Sughrue, Mion, Zinn, Macpeak & Seas, PLLC

[57] ABSTRACT

A hologram is made up from a one-dimensional or two-dimensional slit array, each slit being formed with an electrode pair or electric wire for generating an electric field or magnetic field within the slit. These electric fields or magnetic fields are each set for each slit so as to confer upon an atomic beam passing through the slits a phase shift corresponding to the target hologram reproduced image, thereby allowing the target hologram image to be easily reproduced by directing the atomic beam perpendicular to the hologram surface. A two-dimensional reproduced image can be obtained by means of a one-dimensional slit array by shifting the reproduction substrate for each one-dimensional reproduced image obtained, or a three-dimensional pattern image can be reproduced by means of a two-dimensional slit array by successively changing the focal length and stacking on a preceding two-dimensional reproduced image the next two-dimensional reproduced image each time a two-dimensional reproduced image is obtained and repeating this procedure.

10 Claims, 9 Drawing Sheets

FIG. 10A
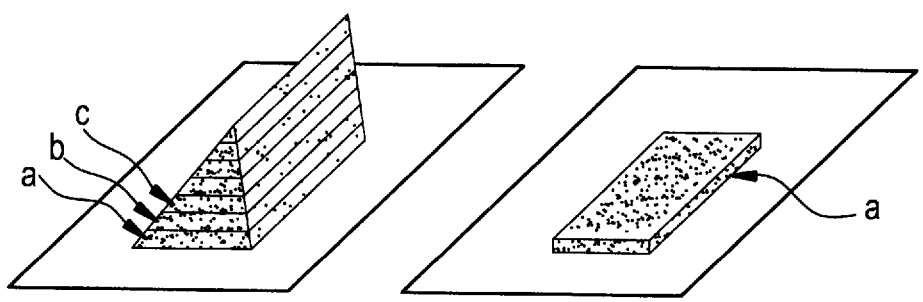
FIG. 10B
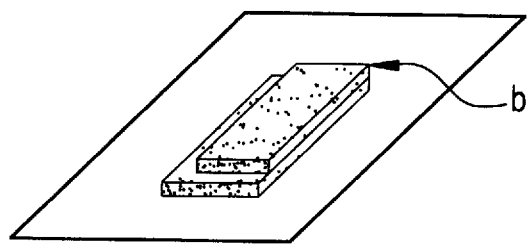
FIG. 10C
FIG. 10D
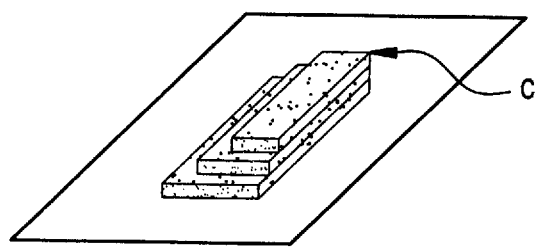

ATOMIC BEAM PATTERN FORMING METHOD USING ATOMIC BEAM HOLOGRAPHY

BACKGROUND OF THE INVENTION

1. Field of the Invention

The present invention relates to a hyperfine pattern transfer technique for very large-scale integrated circuit manufacturing, and in particular to a pattern forming method by atomic beam that employs a hologram.

2. Description of the Prior Art

In the prior art, this type of pattern forming method was realized by a stepper technique in which a mask was placed in contact with a substrate to which a resist was applied, and pattern transfer was achieved by optical exposure. Hyperfine pattern transfer techniques (hereinbelow referred to as "lithography") by means of a stepper necessitated complicated adjustment procedures due to the many lenses used in the optical system. A more serious drawback was the problem that a single extraneous particle adhering to the mask resulted in the formation of fatal defects in the transfer pattern, and yet another drawback was the dependence of pattern resolution upon aberration of the lenses, a dependence which imposed further limitations on the formation of a hyperfine pattern.

In contrast to the above-described method using a stepper, a pattern transfer technique using a hologram can serve as a method of hyperfine lithography, and in pattern transfer by such a holographic technique, the reproduction of a hologram does not require a complex lens system. In addition, pattern transfer can be achieved without using a mask, and as a result, this method suffers little from the effect of extraneous material as does the stepper process. In addition, because pattern data recorded in a hologram are recorded dispersed over the entire hologram surface, the presence of some physical defects in one portion of a hologram is not likely to result in a fatal defect in the reproduced image. In hologram reproduction, moreover, aberration can be eliminated by employing the same optical system in reproduction as are used in recording, and pattern resolution is therefore ultimately determined by wavelength. Regarding this issue of aberration, in contrast with a stepper technique using present reduction optical system in which pattern resolution is determined by the aberration of these optical system, lithography by means of a hologram has the advantage of enabling high-resolution pattern formation at the limit of the wavelength of a simple optical system. Optical lithographic devices using this type of holography are already available on the market, and are being used on a practical level in fabrication processes.

Very large-scale integrated circuit fabrication currently calls for pattern formation on the submicron level, and gradual progress is being made in reducing the wavelength of the light source by using G-line and I-line as light sources in this field. Recently, pattern formation is being considered that employs ultraviolet lasers using KrF or ArF, which have an even shorter wavelength.

Lithographic methods applying holography, while exhibiting the superior characteristics described hereinabove, still suffer from several problems which can be briefly described as follows:

(1) In pattern formation by exposure to light using holography according to the prior art, patterns are first formed in a resist following which the prescribed pattern is formed by lift-off or etching. In other words, if dopant is to be applied locally, processes are required first to form a resist pattern on the substrate, to apply the dopant by ion implantation or evaporation after forming the resist pattern, and finally to peel off the resist; and these processes entail considerable labor and expense.

(2) In pattern formation by holography, the minimum resolution depends on the size of the hologram dry plate and the wavelength of the light source used. In this case, resolution $\delta X$ is given by the formula of the lens optical system $\delta X = \lambda L/D$ (where $\delta X$ is the resolution, $\lambda$ is wavelength, L is the distance between the hologram and lens, and D is the diameter of the hologram). Because there is a limit to the size of the hologram that can be used, the pattern resolution ultimately depends on the wavelength. Here, the wavelength of an atomic wave is on the order of several nm, and holography by atomic wave is therefore theoretically capable of directly inscribing hyperfine patterns without a mask.

The information on a hologram dry plate in such a case is phase and intensity information for a wave realized from a material substance (an object wave) and is obtained from information of physical form (pattern) using a Fourier transform. For this reason, a hologram can be produced artificially through calculation, and a binary calculator hologram was generated by computer in 1967. Digital fast Fourier transform (DFFT) methods have since been improved to allow high-quality reproduction of images, and three-dimensional patterns can also be formed using a computer-constructed hologram method. This type of computer-constructed hologram records optical information, and in particular, phase information from an imaginary object on a hologram as information from 0 to 1. The information-recording surface of the hologram is divided into a finite number of cells with, for example, 100% transparent holes corresponding to "1" and 100% opaque holes representing "0", and these holes are formed in the hologram according to the phase and intensity information from the imaginary object.

In order to increase pattern resolution, therefore, the wavelength should be shortened. In other words, X-rays, or electron beams and atomic beams, which have wavelengths even shorter than current excimer lasers using KrF or ArF, etc. may be effectively used as a light source for microprocessing in lithography. High-resolution holographic pattern forming calls for a light source that propagates waves with good coherence. A matter wave (de Broglie wave) of an electron beam emitted by field emission may also be employed. In Applied Physics Letters (1995, vol. 66, p. 1560), an example is described in which a grating is formed from a biprism (one type of hologram) using a 100 keV electron beam which has a wavelength of 0.03 angstrom. Experiments on coherence using atomic wave have also been conducted, one example being described in Science (1993, Vol. 262, p. 877) in which a micro-diffraction pattern on the micron order is formed using as a diffraction grating the standing wave of a laser beam from laser-cooled chromium atoms. Nevertheless, in diffraction using the standing wave of a laser beam or stationary holograms formed using holes as described hereinabove, the formation of a pattern image corresponding to an arbitrary pattern remains a difficult problem.

(3) In contrast, a paper in Nature, (Vol. 380, No. 6576, pp. 691–694, 25 Apr. 1996) describes a method of manipulating a neon atomic beam using a computer-generated binary hologram. The advantage of using a computer-generated hologram is that a binary hologram of any pattern can be easily obtained. More specifically, an arbitrary pattern is inputted to the computer, and phase information is obtained through a two-dimensional Fourier transform of this pattern. Based on this phase information, phase can be represented by the positions of hole openings and a hologram can be processed. An atomic beam of 7 nm wavelength was irradiated onto a hologram obtained by this type of method, and a clear two-dimensional hologram reproduced image of an "F" pattern was obtained by atomic beam. This method, however, requires the preparation of one hologram for each type of reproduced image. For example, a paper in the Japan Journal of Applied Physics (1992, Vol. 31, pp. 436–438) describes that interference fringes produced by the passage of an atomic beam through double slits undergo electromodulation. This phenomenon indicates change in phase of atomic wave by the Stark effect, and indicates that phase of atomic waves can be controlled by an electric field.

SUMMARY OF THE INVENTION

The object of the present invention is to provide an atomic beam pattern forming method that, by using the properties of an atomic beam in combination with holography, can obtain any atomic pattern by merely controlling the potential of each electrode pair of a slit array having electrode pairs, and that can be applied to hyper-fine lithography.

Another object of the present invention is to provide a method of similarly obtaining any atomic pattern using a slit array having electric wires instead of a slit array having electrode pairs by controlling the magnetic field produced by current passing through each electric wire.

More specifically, the present invention employs an atomic beam hologram made up from a one-dimensional slit array of a plurality of slits arranged at intervals in a row on a substrate surface, each of the slits being provided with an electrode pair for generating an electric field within the slit that is both orthogonal with respect to the direction of the one-dimensional slit array and parallel to the substrate surface; and can obtain any one-dimensional hologram reconstructed pattern by means of an atomic beam passing through the one-dimensional slit array by impressing a potential to the electrode pair of each slit to generate an electric field that gives to the atomic beam passing through that slit a phase shift corresponding to any hologram reconstructed pattern, and directing the atomic beam perpendicular to the atomic beam hologram surface.

In addition, the present invention may employ an atomic beam hologram made up from a one-dimensional slit array of a plurality of slits arranged at intervals in a row on a substrate surface, each of said slits being provided with an electric wire for generating a magnetic field within that slit that is perpendicular with respect to the substrate surface; whereby any one-dimensional hologram reconstructed pattern can be obtained by means of an atomic beam passing through the one-dimensional slit array by passing an electric current through the electric wire of each slit to generate a magnetic field that gives to the atomic beam passing through that slit a phase shift corresponding to an arbitrary hologram reconstructed pattern, and directing the atomic beam perpendicular to the atomic beam hologram surface.

Alternatively, according to another method of the present invention, a two-dimensional hologram reconstructed pattern is obtained using the above-described one-dimensional pattern forming method by first dividing an arbitrary two-dimensional pattern into a plurality of rows of one dimensional patterns; reproducing one-dimensional hologram reconstructed patterns on reproduction substrate one row at a time in order; shifting the reproduction substrate the pitch of one division in a direction orthogonal to the one-dimensional slit arrays each time the reproduction of a one-row portion is completed; and reproducing one-dimensional hologram reconstructed patterns for all one-dimensional patterns of the row divisions.

As yet another method, the present invention employs a two-dimensional atomic beam hologram provided with a two-dimensional slit array that is made up of a plurality of rows of one-dimensional slit arrays of a plurality of slits arranged at intervals in one row on a substrate surface, each of the slits being provided with an electrode pair for generating an electric field within the slit that is both orthogonal with respect to the direction of the one-dimensional slit array and parallel to the substrate surface; and can obtain any two-dimensional hologram reconstructed pattern by means of an atomic beam passing through the two-dimensional slit array by impressing a potential to the electrode pair of each of the slits to generate an electric field that gives to the atomic beam passing through that slit a phase shift corresponding to an arbitrary hologram reconstructed pattern, and directing the atomic beam perpendicular to the atomic beam hologram surface.

In addition, the present invention may employ a two-dimensional atomic beam hologram in which each of the slits is provided with, instead of the above-described electrode pair, an electric wire for generating a magnetic field within the slit that is perpendicular to the substrate surface; whereby any two-dimensional hologram reconstructed pattern can be obtained by means of an atomic beam passing through the two-dimensional slit array by passing an electric current through the electric wire of each of the slits to generate a magnetic field that gives to the atomic beam passing through that slit a phase shift corresponding to an arbitrary hologram reconstructed pattern, and directing the atomic beam perpendicular to the atomic beam hologram surface.

Alternatively, as an atomic beam pattern forming method for obtaining any large-scale two-dimensional hologram reconstructed pattern using the above-described two-dimensional pattern forming method, any large-scale two-dimensional hologram reconstructed pattern can be obtained by: dividing any large-scale two-dimensional pattern into a plurality of small parallel regions; shifting the reproduction substrate the distance of one region in a parallel and orthogonal surface direction each time the reproduction of a two-dimensional hologram reconstructed pattern of one region is completed; and repeating the pattern reproduction a prescribed number of times.

As yet another method of the present invention, any three-dimensional hologram reconstructed pattern can be obtained using the above-described two-dimensional pattern forming method by: partitioning any three-dimensional pattern into a plurality of two-dimensional patterns of differing focal lengths by sectioning at mutually parallel planes; reproducing the two-dimensional hologram reconstructed pattern of the base plane on a reproduction substrate; then reproducing and stacking the two-dimensional hologram reconstructed pattern of the succeeding plane on the reconstructed pattern of the reproduced bottom plane as the focal plane overlying that plane; and then similarly successively reproducing and stacking the two-dimensional hologram reconstructed patterns for all of the two-dimensional patterns.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIGS. 10(a), (b), (c), and (d) are explanatory views of the procedures for creating a pattern of three-dimensional structure.

DETAILED DESCRIPTION OF THE PREFERRED EMBODIMENTS

The embodiments of the present invention will next be described with reference to the accompanying figures.

Figure 1A:
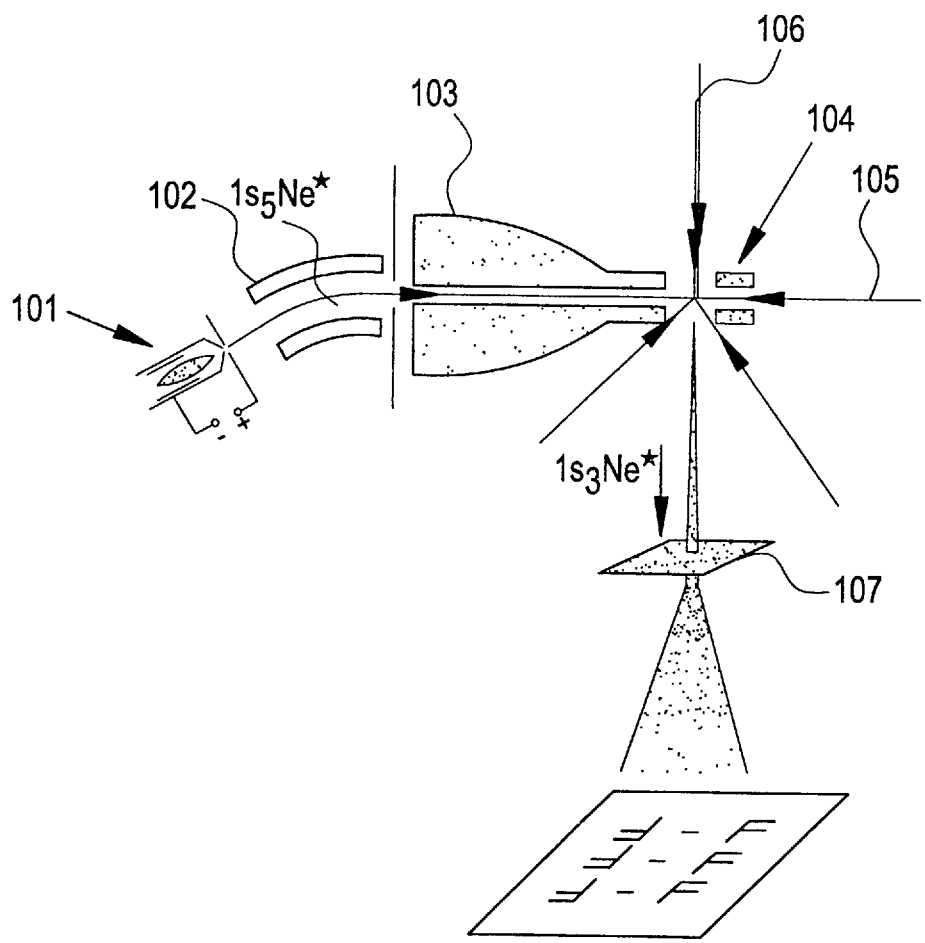
FIG. 1(a) is a schematic diagram showing the arrangement of an atomic beam generating device and a holographic device according to one embodiment of the present invention.
Figure 1B:
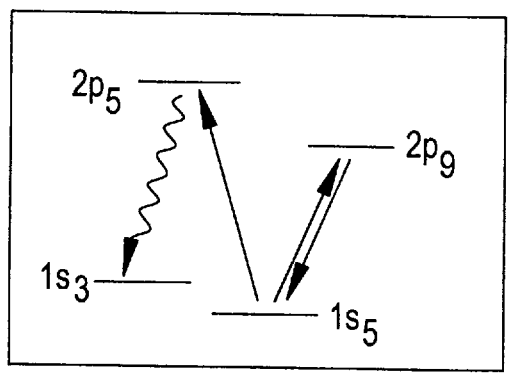
FIG. 1(b) is an explanatory view of the change in energy level of neon atoms.

Explanation will first be presented regarding basic holography and the generation of atomic beams that serves as the basis for atomic beam holographic applications. FIG. 1(a) shows the basic configuration of a holographic device that is applied in a pattern forming method using atomic beam holography in the present invention, and FIG. 1(b) is an explanatory view of the change in energy level of neon atoms used in the atomic beam of this device.

Use of an atomic beam for hologram reproduction calls for an atomic wave of uniform wavelength. The atomic beam source generates neon atoms at an ultralow temperature by a laser trap method. A detailed description of pattern reproduction by atomic beam holography will be presented after laying out an outline of this device.

In general terms, this device is constructed from discharge section 101 that generates neon atoms in an excited state by glow discharge, deflector 102 for eliminating ions from the atomic source, Zeeman slower 103 that forms a first cooling region, and a magneto-optic trap 104 that forms a second cooling region.

The excited ground state $1s_5$ of neon gas is 16 eV, and transition from the ground state cannot be used for cooling. As shown in FIG. 1(b), the transition between $1s_5$ and $2p_9$ is used in a neon atom laser trap. This excited ground state is a metastable state of long duration. The section that generates neon in this metastable state is discharge section 101. The neon atoms in an excited state pass through deflector 102 in which unwanted ions and electrons are removed and are then directed to Zeeman slower 103. Neon atoms at a temperature of about 300° K. have a speed of approximately 600 m/sec as a kinetic speed. Here, a counter-propagating cooling laser beam 105 slows the atomic beam. The motion of the neon atoms is slowed through collisions with photons that oppose the direction of their flight. Since the direction in which photons are absorbed by the neon atoms is constant and the direction of spontaneous emission of photons from the neon atoms is random at this time, transfer of mean kinetic momentum that accompanies the photon emission in the process of the multitude of repeated emission of photons is zero and the momentum or the speed of the neon atoms is reduced by absorption of photons. In the case of neon, for example, absorption and emission is repeated more than 20,000 times by the time of halting and takes 700 μsec, the neon atoms traveling 23 cm during this time interval. Nevertheless, the neon atoms are influenced by the Doppler effect in the time from 600 m/sec to halting. The shift in resonance frequency resulting from this Doppler effect, however, is far greater than the width γ of the spectrum of transition used in cooling, and resonance is quickly lost if the laser frequency is fixed and does not change. This shift from resonance frequency (Doppler shift) is corrected by the Zeeman effect, and the resonance frequency is held at a constant, the effect of Zeeman slower 103 therefore being to slow the atomic beam without changing the laser frequency. The Doppler shift is great at the entrance to Zeeman slower 103, but because the amount of Doppler shift decreases with slowing, a gradient is added to the magnetic field intensity of a solenoid (Doppler tuning solenoid) for correcting this, and a magnetic field distribution is established that is in proportion to the square root of the distance.

The speed of the neon atoms at the exit from Zeeman slower 103 is on the order of several tens m/sec. The exit of Zeeman slower 103 is connected to magneto-optic trap 104 which is provided to finally trap the neon atoms. At magneto-optic trap 104, a magneto-optic trap effect is constructed by lasers from four directions and a quadrapole magnetic field. An inverted solenoid is placed on the central axis of the Doppler tuning solenoid, and a quadrapole magnetic field is formed in the space of these two components. Within the quadrapole magnetic field, the atoms receive the Zeeman effect of the magnetic field regardless of their direction of movement, and the resonance frequency of transition falls. As a result, the laser light constantly directed in the central direction is closer to resonance, and a force is constantly exerted in a central direction on the neon atoms. At the same time, Doppler cooling is also effected.

In this way, the neon atoms are trapped at the center of the quadrapole magnetic field, and an atomic cloud forms in the trapped region, the diameter of this cloud being 50 μm or less, which is close to a point source. The absolute temperature of these trapped neon atoms is on the order of 50 m°K. Next, transfer laser 106 of wavelength of 598 nm is irradiated from above as shown in FIG. 1(a) so as to release these trapped atoms (cloud) from the trap. This laser 106 causes the trapped neon atoms to make a transition from $1s_5$ to $2p_5$, emit a UVU photon and shift to a $1s_3$ state, and be released from the trap. The released neon atoms fall freely through the gravitational field. Neon atoms beginning their free-fall accelerate under the force of gravity. In this device, the neon atoms reach the surface of hologram 107 after falling approximately 40 cm, at which point the neon atoms have attained a speed of 280 cm/sec and a de Broglie wavelength ($\gamma$=h/mv) of approximately 7 nm.

The foregoing explanation regards a case in which a neon atomic beam is used, but other atomic beams based on other elements may also be employed including, for example, sodium, aluminum, silicon, calcium, nickel and silver.

Using an ultralow temperature atomic beam source based on the above-described principles, the method of the present invention allows the reproduction of each type of pattern image by atomic beam holography using an electric field-modulated hologram or a magnetic field-modulated hologram.

Figure 2:
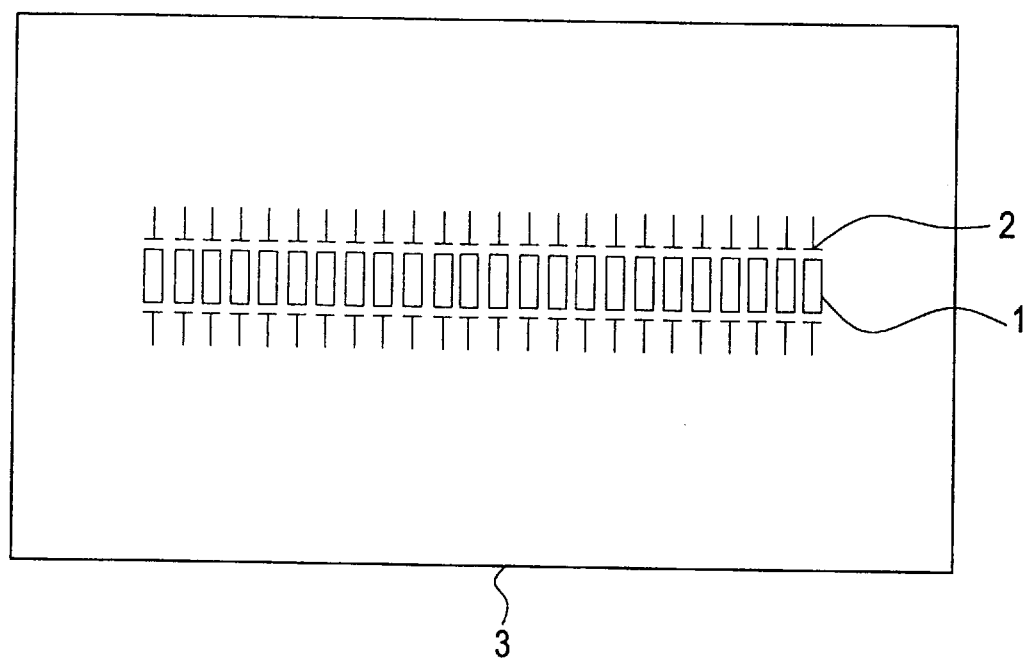
FIG. 2 shows the construction of a one-dimensional hologram having electrode pairs.

First, FIG. 2 shows a hologram using a one-dimensional slit array having electrode pairs. This slit array is formed from a large plurality of slits 1 aligned in one row in silicon nitride (SiN) hologram substrate 3 having a thickness of 500 nm, slit 1 having a width of 1 micron and a length of 5 microns. In this embodiment a slit array comprising 256 slits is employed, and at each slit an electrode pair 2 is arranged so as to generate an electric field orthogonal to the direction of arrangement of the slit array and parallel to the surface of the hologram substrate. In addition, an electric potential can be impressed to the electrode pair of each slit independently to generate an electric field.

Figure 3A:
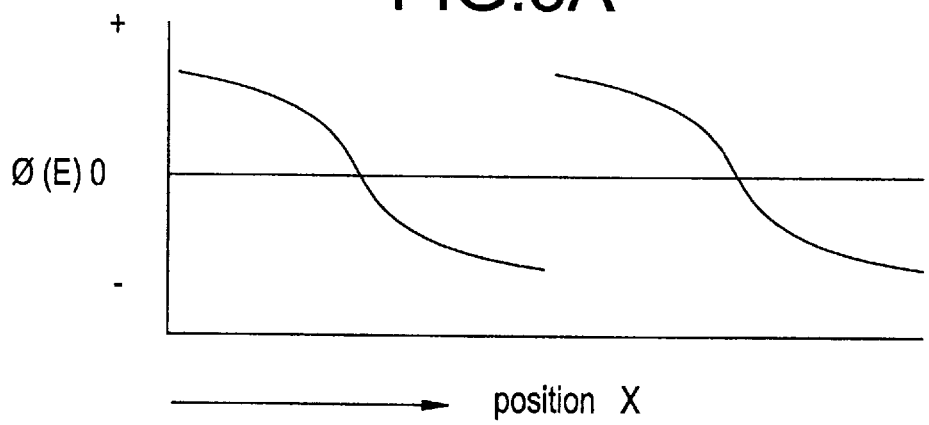
FIG. 3(a) is a curve chart showing the amount of phase shift given to each slit of a one-dimensional hologram having electrode pairs.
Figure 3B:
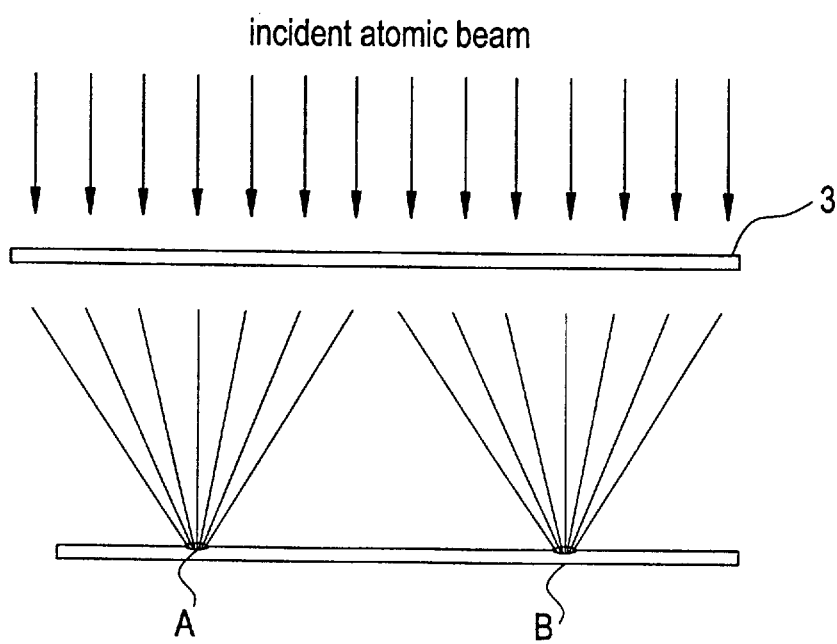
FIG. 3(b) is an view illustrating the principle of pattern image reproduction by an incident atomic beam.

The principles of operation of this slit array having electrode pairs are next illustrated in FIG. 3. In FIG. 3(a), coordinate X on the horizontal axis shows the position in the direction of arrangement of the one-dimensional slit array. The vertical axis of FIG. 3(a) shows the amount of phase shift $\phi(E)$ to be given o an incident atomic beam passing through slit 1 at each position corresponding to the X axis. The amount of phase shift $\phi(E)$ to the incident atomic beam is proportional to the square of the electric field, and by impressing an electric potential to the slit electrode pair 2 at each corresponding position so as to generate a phase shift amount $\phi(E)$ of the form shown in the example of FIG. 3(a), the incident atomic beam directed at a hologram constituted by this one-dimensional slit array having electrode pairs can be adjusted so as to focus at the two points A and B shown in FIG. 3(b).

Figure 4:
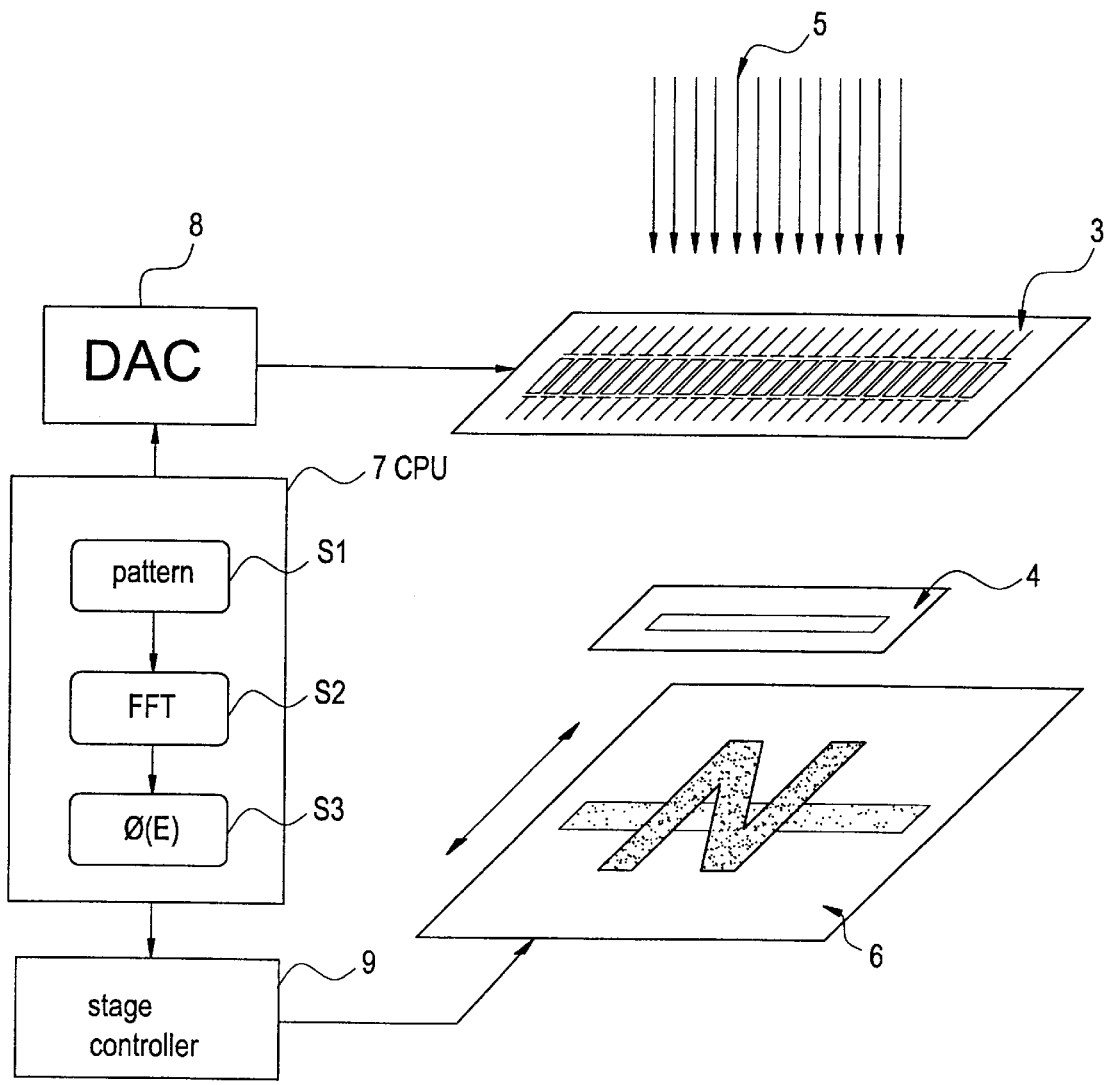
FIG. 4 is an explanatory view of the two-dimensional reproduction method by a one-dimensional hologram having electrode pairs.

FIG. 4 is a block diagram of a two-dimensional pattern forming method using a one-dimensional slit array based on these principles. The pattern information corresponding to any two-dimensional pattern 6 to be reproduced is divided by CPU 7 into a large number of parallel one-dimensional pattern information. In this case, the information is divided into 256 rows (Step S1). Fourier transforms are carried out corresponding to the number of slits of the slit array for one row of one-dimensional information (Step S2), and the phase information $\phi(E)$ at each slit position is calculated (Step S3). The impressed voltage at each slit position is calculated based on this phase information $\phi(E)$, and electric potential is impressed to each electrode pair 2 by way of digital-analog converter 8. When atomic beam 5 is irradiated into this one-dimensional slit array, diffraction occurs and a one-dimensional pattern is reproduced. In this reproduction system, aperture 4 is provided between the hologram surface and the substrate surface to eliminate a higher-mode reproduction image of atomic beam 5. With the completion of reproduction of one one-dimensional pattern by atomic beam irradiation of one slit array, substrate stage controller 9 causes the substrate stage to shift the distance of one slit array in a direction orthogonal to the direction of the slit array, and the same steps are repeated for the phase information of the succeeding slit array, atomic beam 5 being irradiated and the second reproduction pattern obtained. Synchronizing the movement of the substrate stage and the reproduction of the divided one-dimensional pattern information and repetition of the same operations enables the reproduction of any original two-dimensional pattern as an atomic beam pattern.

Figure 5:
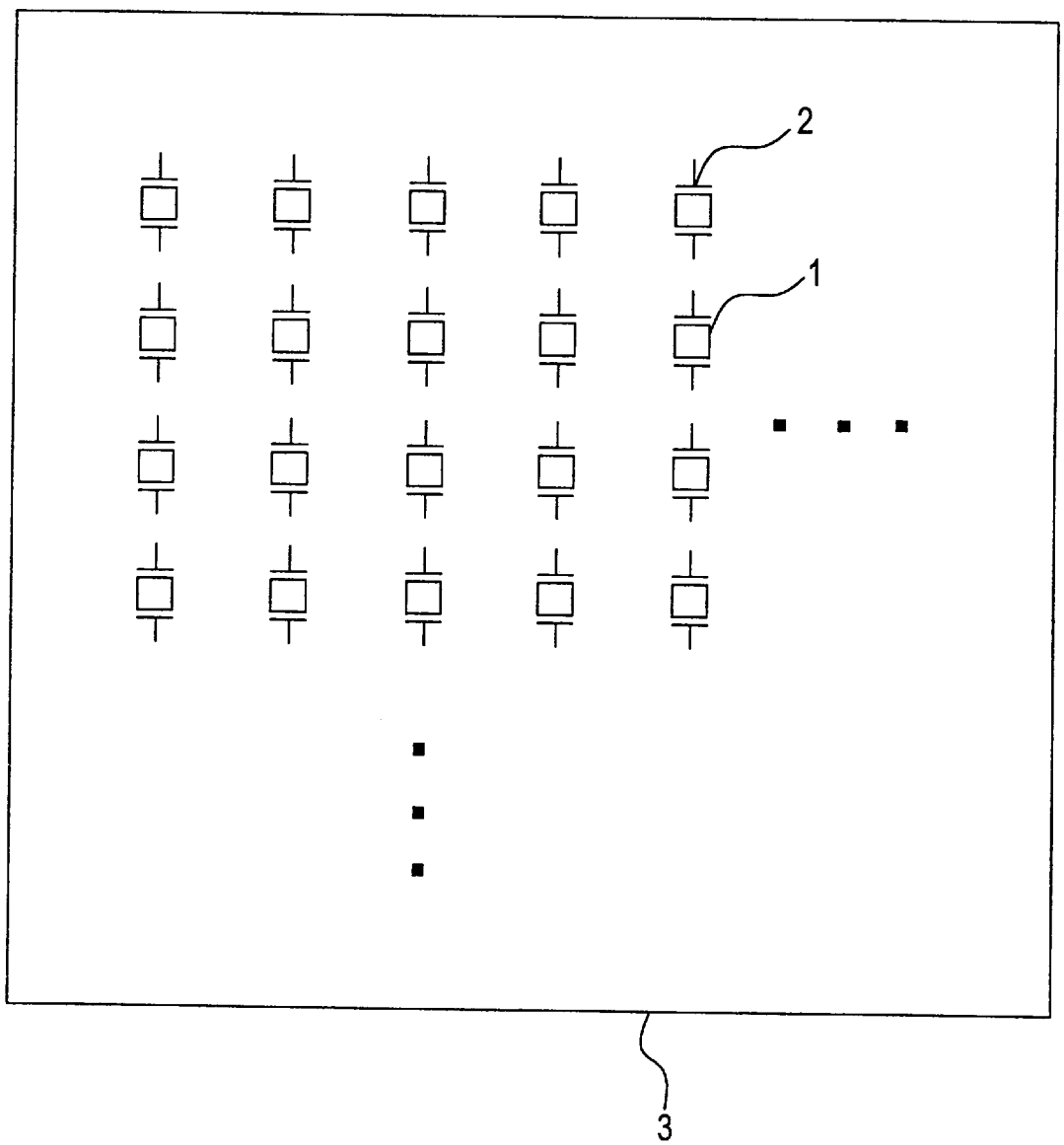
FIG. 5 shows the construction of a two-dimensional hologram having electrode pairs.
Figure 6:
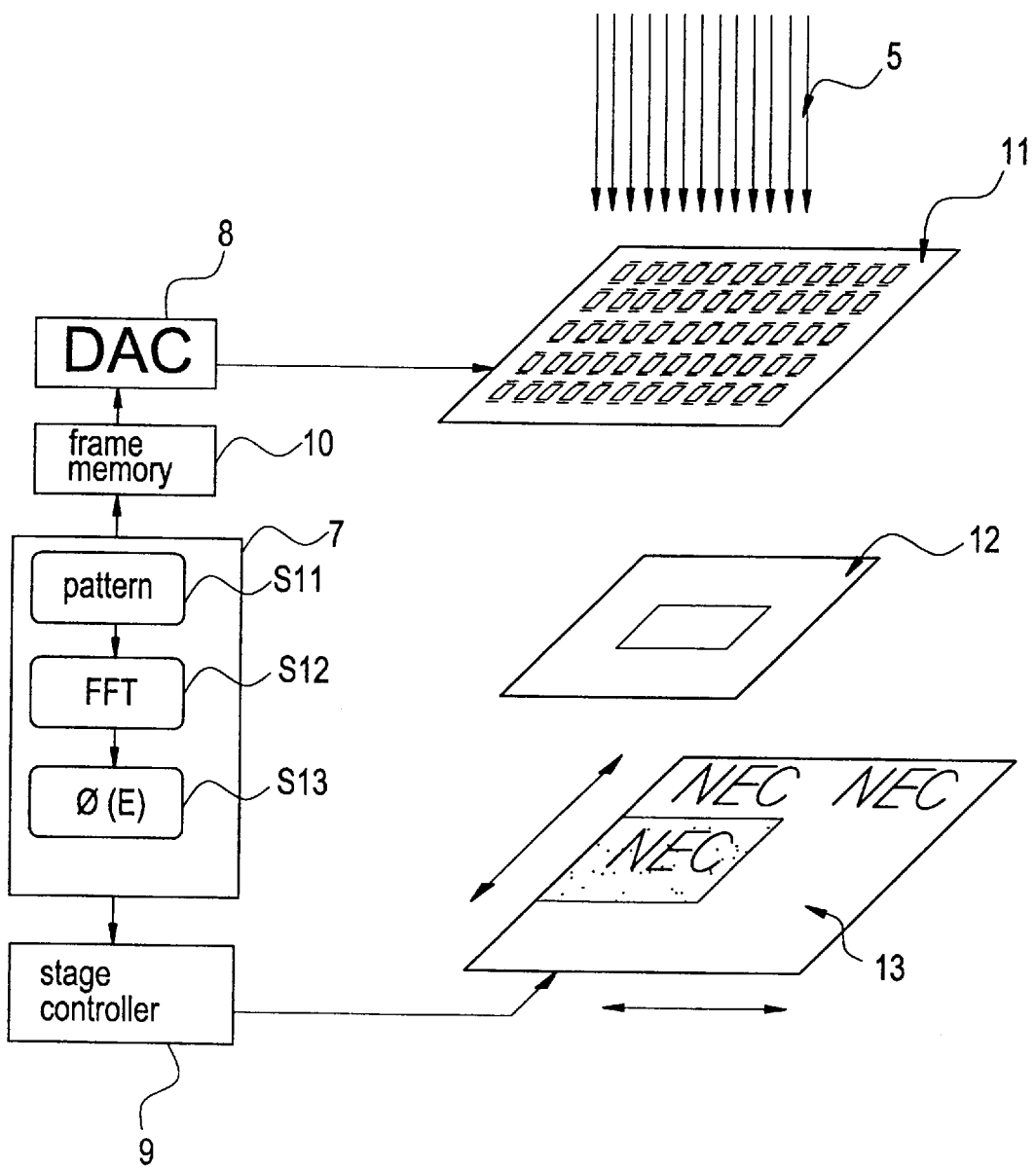
FIG. 6 is an explanatory view of the two-dimensional pattern reproduction method by means of a two-dimensional hologram having electrode pairs.

Explanation will next be presented regarding atomic beam holographic reproduction using a hologram provided with a two-dimensional array having electrode pairs. FIG. 5 shows a two-dimensional slit array having electrode pairs formed on silicon nitride (SiN) hologram substrate 3 as in FIG. 2. In this two-dimensional hologram having electrode pairs, 1-micron square slits (holes) 21 are formed at a pitch of 4 microns, and electrode pairs are formed at two ends of these slits. The basic difference with respect to a binary hologram of the prior art is that, in contrast with a binary hologram realized by a prior-art calculator in which phase is represented by the position of holes or amplitude by the number of holes per unit area, the position of the holes in the hologram having electrode pairs is systematically fixed. The reason for this is that the phase of an atomic wave passing through the holes can be controlled by the impressed potential as described hereinabove. FIG. 6 shows a schematic view of the configuration of an atomic beam holographic reproduction device that employs such a hologram having electrode pairs. First, an arbitrary two-dimensional pattern 13, which is the object of reproduction, is read in by CPU7 (Step S11), and converted by two-dimensional Fourier transform (Step S12) and phase information is obtained to be set for each hole of the hologram having electrode pairs (Step S13). This phase information is converted to potential information to be impressed to each electrode pair, and stored in frame memory 10. Then electric potential based on this potential information is impressed to the electrode pair of each hole by way of digital-analog converter B. In the case of this system, substrate stage movement is controlled by a calculator, and with the completion of each two-dimensional hologram reproduction, the stage is moved a prescribed distance. This type of combination with substrate stage movement is advantageous in atomic beam pattern forming because, for example, a large pattern that cannot be accommodated in one hologram can be divided and an extensive pattern formed through the combination with stage movement.

In all of the examples described hereinabove, a one-dimensional or two-dimensional slit array having electrode pairs is employed and an electric field is generated within each slit that confers a required phase shift to an atomic beam passing through the slit, but in every case, an equivalent effect can be obtained by generating a magnetic field instead of an electric field within each slit.

Figure 7:
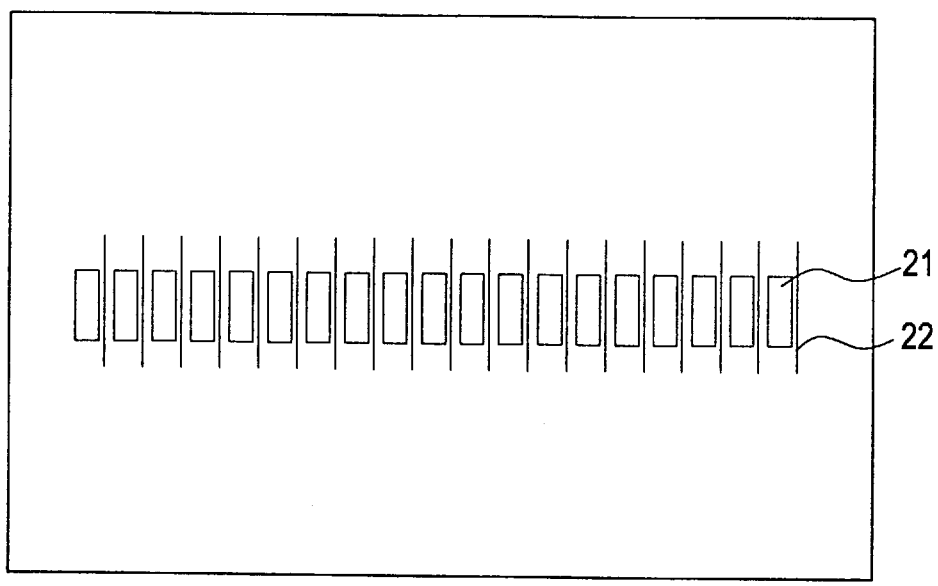
FIG. 7 shows the construction of a one-dimensional hologram having electric wires.
Figure 8:
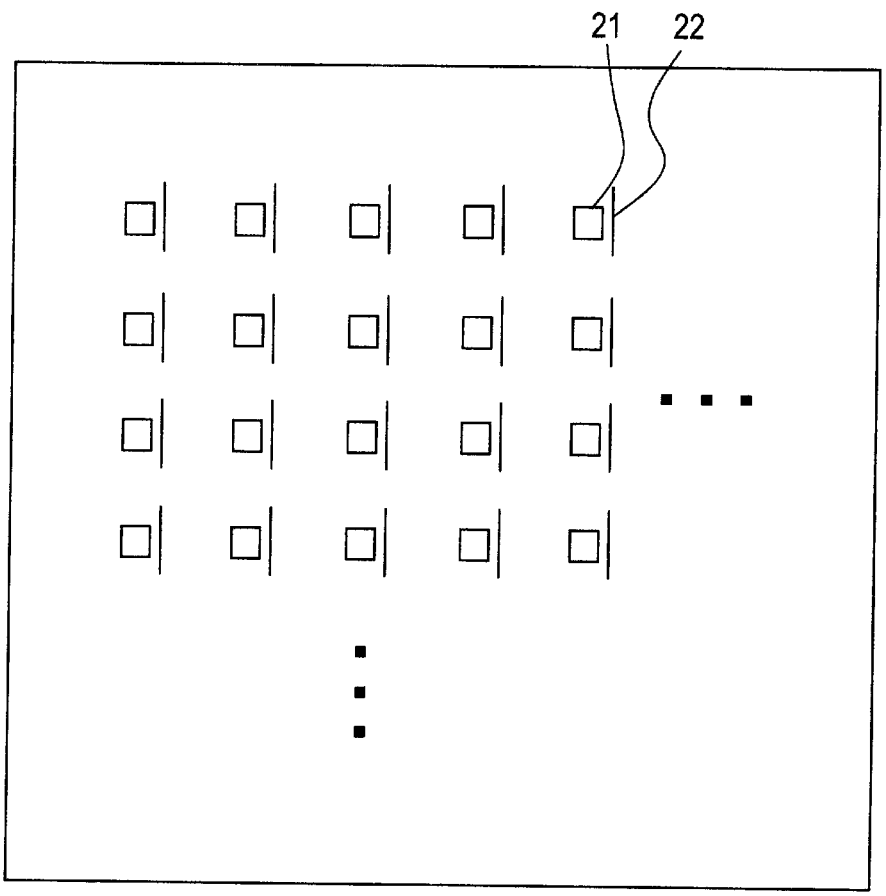
FIG. 8 shows the construction of a two-dimensional hologram having electric wires.
Figure 9:
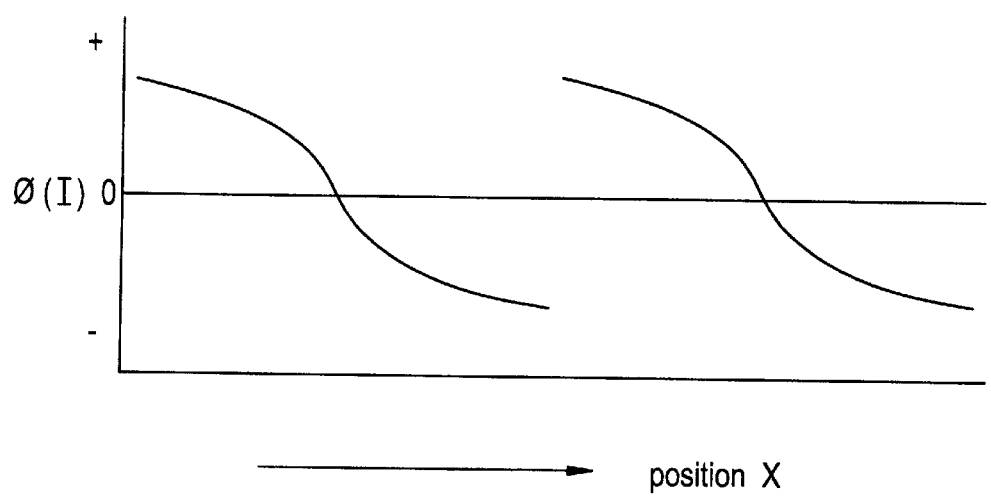
FIG. 9 is curve chart showing the amount of phase shift given to each slit of a one-dimensional hologram having electric wires.

FIG. 7 and FIG. 8 show holograms provided with a one-dimensional and two-dimensional slit arrays, respectively. An electric wire 22 is provided immediately adjacent to each slit 21 which is orthogonal with respect to the direction of the one-dimensional slit array and in the direction of the hologram surface, and by passing a current through this electric wire 22, a magnetic field can be generated within the slit. As shown in FIG. 9, the required hologram reconstructed pattern can be obtained by causing the current to pass through each electric wire 22 for a slit 21 at position X so as to generate a magnetic field that confers to the atomic beam passing through that slit a phase shift $\phi(I)$ corresponding to the arbitrary hologram reconstructed pattern which is the object. The curve $\phi(I)$ of FIG. 9 is identical to the curve $\phi(E)$ shown in FIG. 3(a), and accordingly, any person versed in the art can easily recognize that an effect can be obtained that is identical to that of an electric field described hereinabove.

According to yet another embodiment of the present invention, an arbitrary three-dimensional pattern can be formed by using a two-dimensional atomic beam hologram having either electrode pairs or electric wires as described hereinabove. In ordinary Fourier transforms, calculation is carried out with the distance from an object to the hologram surface and to the reproduction image fixed. Of course, if the hologram has sufficient capacity, all of the information for a three-dimensional object can be recorded. However, a three-dimensional image having sufficient contrast is difficult to reproduce with the limited amount of information in a hologram that can be formed in actuality. This embodiment, however, allows a three-dimensional pattern to be reproduced and stacked by atomic beam holography as shown in FIG. 10(a).

This three-dimensional pattern is first divided into a number of two-dimensional patterns, which can be identified as plane a, plane b, plane c, and so on starting from the bottom end (FIG. 10(a)). Each of the planes a, b, c, and so on can be reproduced as a two-dimensional hologram, each having a different focal length and pattern configuration. The hologram data are calculated for each plane a, b, c, . . . , and reproduced by atomic beam in order from plane a, the height increasing upon reproduction of plane a due to stacking by the atomic beam (FIG. 10 (b)), this upper surface becoming the focal plane during the reproduction of the next plane b. Plane b is then reproduced (stacked) (FIG. 10(c)), followed in order by plane c (FIG. 10(d)), and this successive stacking enables reproduction of a three-dimensional configuration. Such a process is effective in the formation of, for example, a Fresnel zone plate. Features of atomic beam stacking include the insignificant damage to the substrate due to the low energy of atoms as well as the low level of migration, and on this point, this method stands in sharp contrast to an ion implantation method in which atoms are similarly manipulated but at a higher ion energy level of several tens of keV. In pattern formation by an atomic beam hologram, which uses wave motion, atoms touch down on the substrate surface gently, and three-dimensional pattern formation is possible for this very reason.

An important characteristic of pattern formation by atomic beam holography as described hereinabove is the freedom with which the size of a reproduced pattern can be altered. The hologram itself causes diffraction of the wave motion of the atomic beam, and the introduction of the diffraction component of a lens into it enables enlargement or reduction of the hologram reproduced image. Another possibility is amendment of the original pattern by design. This function in particular not only enables free control of the size of a reproduced pattern during hologram reproduction, but also allows real-time control, making this method extremely effective in micropattern formation. In other words, distortion in an object pattern can be intentionally corrected and the shape amended while viewing the actual pattern.

As described hereinabove, the present invention: allows a hologram reproduced image of an arbitrary pattern to be obtained using an atomic beam hologram provided with a one-dimensional or two-dimensional slit array by conferring a potential to the electrode pair or by passing a current through the electric wire provided to each slit so as to form an electric field or a magnetic field that confers a required phase shift to the atomic beam passing through the slit; enables formation of a one-dimensional or two-dimensional hyperfine pattern due to the short wavelength of the atomic beam; and moreover, enables reproduction of continuous patterns, three-dimensional patterns, as well as atomic beam patterns that are changed over time; i.e., enables the formation of surface relief three-dimensional patterns. Due to these features, the present invention may be applied to atomic beam interferometers and large-scale integrated circuits demanding hyperfine processing, allows easy formation of three-dimensional patterns such as surface relief Fresnel zone plates; and improves quality in industrial manufacturing.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method for forming an atomic beam pattern wherein an atomic beam hologram is employed which is made up from a one-dimensional slit array of a plurality of slits arranged at intervals in a row on a substrate surface, each of said slits being provided with an electrode pair for generating an electric field within that slit that is both orthogonal with respect to the direction of said one-dimensional slit array and parallel to said substrate surface, comprising the steps of:

impressing a potential to the electrode pair of each of said slits to generate an electric field that gives to the atomic beam passing through that slit a phase shift corresponding to an arbitrary hologram reconstructed pattern, directing the atomic beam perpendicular to said atomic beam hologram surface, and obtaining any one-dimensional hologram reconstructed pattern by means of an atomic beam passing through said one-dimensional slit array.

2. A method for forming an atomic beam pattern wherein the method of claim 1 is employed to obtain any two-dimensional hologram reconstructed pattern, comprising the steps of:

dividing an arbitrary two-dimensional pattern into a plurality of rows of one dimensional patterns;

reproducing one-dimensional hologram reconstructed patterns on a reproduction substrate one row at a time in order; and shifting the reproduction substrate the pitch of one division in a direction orthogonal with respect to the one-dimensional slit arrays each time the reproduction of a one-row portion is completed;

and reproducing one-dimensional hologram reconstructed patterns for all one-dimensional patterns of the row divisions to obtain any two-dimensional hologram reconstructed pattern.

3. A method for forming an atomic beam pattern wherein employing an atomic beam hologram is employed which is made up from a one-dimensional slit array of a plurality of slits arranged at intervals in a row on a substrate surface, each of said slits being provided with an electric wire for generating a magnetic field within that slit that is perpendicular with respect to said substrate surface, comprising the steps of:

passing an electric current through the electric wire of each of said slits to generate a magnetic field that gives to the atomic beam passing through that slit a phase shift corresponding to an arbitrary hologram reconstructed pattern, directing the atomic beam perpendicular to said atomic beam hologram surface, and obtaining any one-dimensional hologram reconstructed pattern by means of an atomic beam passing through said one-dimensional slit array.

4. A method for forming an atomic beam pattern wherein method of claim 3 is employed to obtain a two-dimensional hologram reconstructed pattern by, comprising the steps of:

dividing an arbitrary two-dimensional pattern into a plurality of rows of one dimensional patterns;

reproducing one-dimensional hologram reconstructed patterns on a reproduction substrate one row at a time in order;

shifting the reproduction substrate the pitch of one division in a direction orthogonal with respect to the one-dimensional slit arrays each time the reproduction of a one-row portion is completed;

and reproducing one-dimensional hologram reconstructed patterns for all one-dimensional patterns of the row divisions to obtain any two-dimensional hologram reconstructed pattern.

5. A method of forming an atomic pattern by employing a two-dimensional atomic beam hologram provided with a two-dimensional slit array that is made up of a plurality of rows of one-dimensional slit arrays of a plurality of slits arranged at intervals in one row on a substrate surface, each of said slits being provided with an electrode pair for generating an electric field within that slit that is both orthogonal with respect to the direction of the one-dimensional slit array and parallel to the substrate surface, comprising the steps of:

impressing a potential to the electrode pair of each of said slits to generate an electric field that gives to the atomic beam passing through that slit a phase shift corresponding to an arbitrary hologram reconstructed pattern, directing the atomic beam perpendicular to said atomic beam hologram surface, and obtaining any two-dimensional hologram reconstructed pattern by means of an atomic beam passing through said two-dimensional slit array.

6. A method for forming an atomic beam pattern wherein the method of claim 5 is employed to obtain any large-scale two-dimensional hologram reconstructed pattern, comprising the steps of:

dividing an arbitrary large-scale two-dimensional pattern into a plurality of small parallel regions;

reproducing two-dimensional hologram reconstructed patterns of small parallel regions on a reproduction substrate one region at a time in order, shifting the reproduction substrate the distance of one region in a parallel and orthogonal surface direction each time the reproduction of a two-dimensional hologram reconstructed pattern of one region is completed; and repeating pattern reproduction a prescribed number of times.

7. A method for forming an atomic beam pattern wherein the method of claim 5 is employed to obtain any three-dimensional hologram reconstructed pattern, comprising the steps of:

partitioning an arbitrary three-dimensional pattern into a plurality of two-dimensional patterns of differing focal lengths by sectioning at mutually parallel planes;

reproducing the two-dimensional hologram reconstructed pattern of the base plane on a reproduction substrate;

then reproducing and stacking the two-dimensional hologram reconstructed pattern of the succeeding plane on the reconstructed pattern of the reproduced bottom plane as the focal plane overlying that plane;

and similarly successively reproducing and stacking the two-dimensional hologram reconstructed patterns for all of the two-dimensional patterns.

8. A method for forming an atomic pattern by employing a two-dimensional atomic beam hologram provided with a two-dimensional slit array that is made up of a plurality of rows of one-dimensional slit arrays of a plurality of slits arranged at intervals in one row on a substrate surface, each of said slits being provided with an electric wire for generating a magnetic field within that slit that is perpendicular with respect to the substrate surface, comprising the steps of:

passing an electric current to the electric wire of each of said slits to generate a magnetic field that gives to the atomic beam passing through that slit a phase shift corresponding to an arbitrary hologram reconstructed pattern, directing the atomic beam perpendicular to said atomic beam hologram surface, and obtaining any two-dimensional hologram reconstructed pattern by means of an atomic beam passing through said two-dimensional slit array.

9. A method for forming an atomic beam pattern wherein the method of claim 8 is employed to obtain any large-scale two-dimensional hologram reconstructed pattern by, comprising the steps of:

dividing an arbitrary large-scale two-dimensional pattern into a plurality of small parallel regions;

reproducing two-dimensional hologram reconstructed patterns of small parallel regions on a reproduction substrate one region at a time in order, shifting the reproduction substrate the distance of one region in a parallel and orthogonal surface direction each time the reproduction of a two-dimensional hologram reconstruct pattern of one region is completed; and repeating pattern reproduction a prescribed number of times.

10. A method for forming an atomic beam pattern wherein the method of claim 8 is used to obtain any three-dimensional hologram reconstcuted pattern, comprising the steps of:

partitioning an arbitrary three-dimensional pattern into a plurality of two-dimensional patterns of differing focal lengths by sectioning at mutually parallel planes;

reproducing the two-dimensional hologram reconstructed pattern of the base plane on a reproduction substrate;

then reproducing and stacking the two-dimensional hologram reconstructed pattern of the succeeding plane on the reconstructed pattern of the reproduced bottom plane as the focal plane overlying that plane;

and similarly successively reproducing and stacking the two-dimensional hologram reconstructed patterns for all of the two-dimensional patterns.

* * * * *

UNITED STATES PATENT AND TRADEMARK OFFICE
CERTIFICATE OF CORRECTION

PATENT NO. : 5,834,769
DATED : November 10, 1998
INVENTOR(S) : Jun-Ichi FUJITA, Fujio SHIMIZU and Shinji MATUI It is certified that error appears in the above-identified patent and that said Letters Patent is hereby corrected as shown below:

Column 7, line 2, delete "$(\gamma = h/mv)$" and insert --$(\lambda = h/mv)$--.

Column 8, line 33, delete "B" and insert --8--.

Signed and Sealed this

Twenty-second Day of June, 1999

Attest:

Q. TODD DICKINSON

*Attesting Officer*  *Acting Commissioner of Patents and Trademarks*